United States Patent [19]
Poduje et al.

[11] Patent Number: 5,332,352
[45] Date of Patent: * Jul. 26, 1994

[54] ROBOT PREALIGNER

[75] Inventors: Noel S. Poduje, Needham Heights; Roy S. Mallory, Bedford, both of Mass.

[73] Assignee: ADE Corporation, Newton, Mass.

[ * ] Notice: The portion of the term of this patent subsequent to Apr. 7, 2009 has been disclaimed.

[21] Appl. No.: 863,819

[22] Filed: Apr. 6, 1992

Related U.S. Application Data

[63] Continuation of Ser. No. 320,276, Mar. 7, 1989, Pat. No. 5,102,280.

[51] Int. Cl.$^5$ ............................................... B25J 9/06
[52] U.S. Cl. .............................. 414/225; 414/744.5; 414/744.6; 901/6; 901/15
[58] Field of Search .................. 414/225, 744.5, 744.6, 414/744.8, 749, 786; 901/15, 21, 6

[56] References Cited

U.S. PATENT DOCUMENTS

| | | | |
|---|---|---|---|
| 4,457,664 | 7/1984 | Judell et al. | 414/779 |
| 4,695,215 | 9/1987 | Jacoby et al. | 414/225 |
| 4,836,733 | 6/1989 | Hertel et al. | 414/225 |
| 4,897,015 | 1/1990 | Abbe et al. | 414/744.8 |

Primary Examiner—Michael S. Huppert
Assistant Examiner—Donald W. Underwood
Attorney, Agent, or Firm—Weingarten, Schurgin, Gagnebin & Hayes

[57] ABSTRACT

An alignment station for elements such as semiconductor wafers on a robot arm uses a rotating support and edge detector which in combination are operative to place a wafer on the rotating support, detect wafer alignment, move the wafer to bring it into alignment either on the rotating support itself or onto a separate station.

22 Claims, 3 Drawing Sheets

ROBOT PREALIGNER

This application is a continuation of application Ser. No. 07/320,276, filed Mar. 7, 1989, now U.S. Pat. No. 5,102,280.

FIELD AND BACKGROUND OF THE INVENTION

The present invention relates to robot arm manipulators for elements and means for aligning objects on the robot arm into a predetermined position.

Robot arms are increasingly being utilized for moving objects from one location to another. In the application of robotics to semiconductor wafer processing as shown in the U.S. Pat. No. 4,897,015, issued on Jan. 30, 1990 commonly assigned herewith, a robot arm is useful for conveying a semiconductor wafer from one location to another through the use of independently controllable radial, circumferential and elevational motions. For many purposes, however, it is important that the wafer transported by the robot arm must be placed in a predetermined alignment with respect to its centroid and fiducial.

BRIEF SUMMARY OF THE INVENTION

According to the teaching of the present invention a robot arm is operative with an alignment station to adjust the orientation of a wafer or other element on the robot arm to a predetermined alignment for use by the robot arm in placing the wafer at a neighboring station in a desired orientation.

In particular implementation the robot arm includes manipulator having independently controlled and isolated radial, circumferential and elevational motions (r, $\theta$, z). A rotating support is provided within the range of placement for a semiconductor wafer carried by the robot arm and has associated with it an edge detector which determines the location of a water edge as it is rotated on the rotary support. The robot arm executes r $\theta$ z independent commands to cradle a wafer on its end effector or hand from a first location. The robot arm then places the wafer upon the rotary support where it is spun with the edge over the edge detector. The edge location is detected by electronics which determines the amount of motion of the centroid to produce alignment of the wafer on the rotary support and/or to locate the wafer fiducial in a predetermined location. The robot arm is then manipulated in a first case to move the wafer on the rotary support until alignment is secured with the fiducial relocated to a predetermined position. The wafer again picked up by the robot arm for delivery to a further station in predetermined alignment. In a second case the robot arm is operative to pick up the wafer with the known misalignment and correct for such misalignment in delivering the wafer to a subsequent station.

BRIEF DESCRIPTION OF THE DRAWING

These and other features of the present invention are more fully illustrated below in the solely exemplary detailed description and accompanying drawing of which.

DETAILED DESCRIPTION

Figure 1:
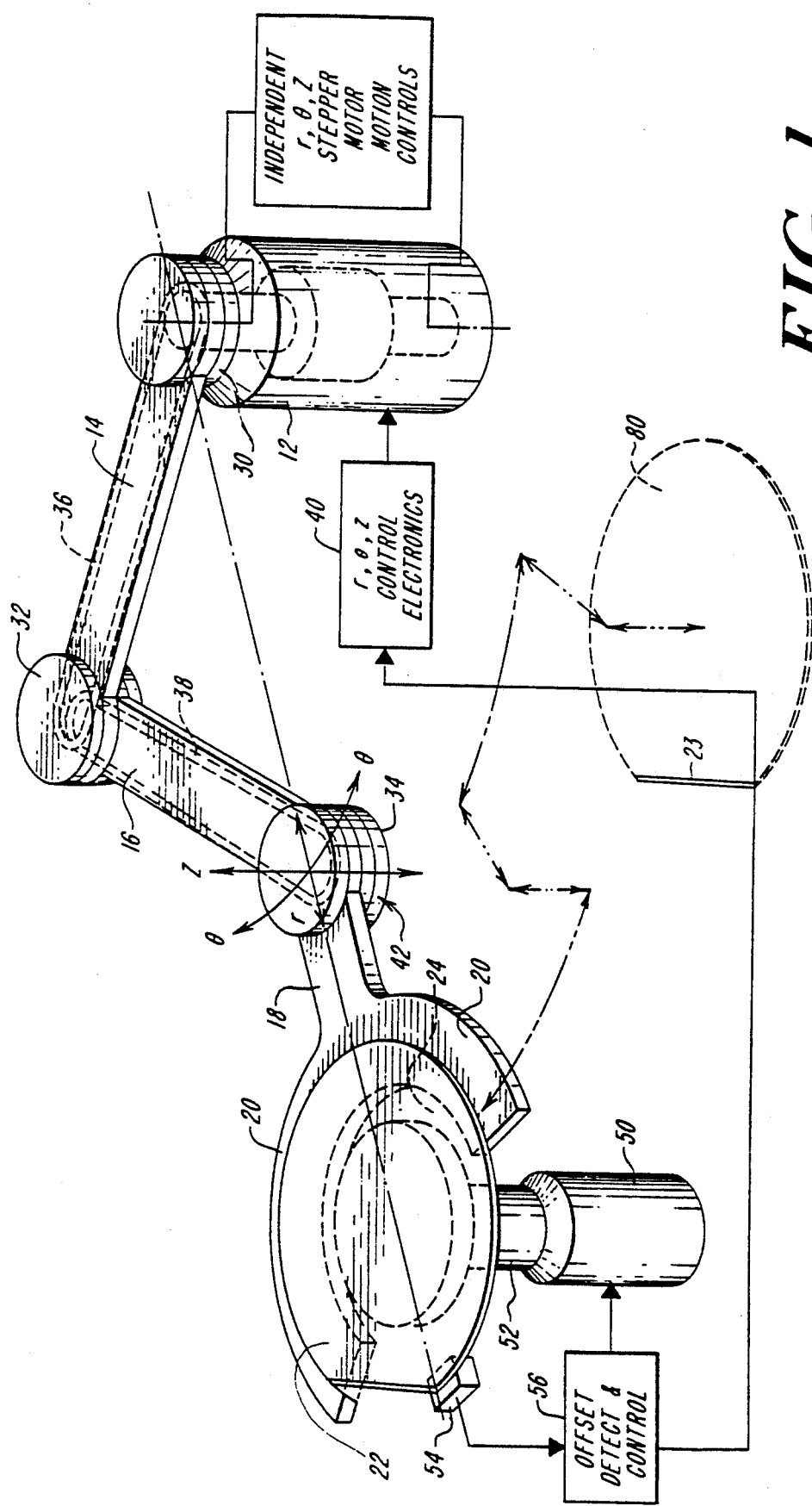
FIG. 1 shows a perspective view of a robot arm and alignment aid according to the present invention; p

The present invention contemplates an alignment aid for a robot arm which permits the alignment of an element such as a semiconductor wafer, being manipulated and transported by the arm, to be adjusted in alignment for delivery to a predetermined location with a predetermined alignment.

In commonly assigned United States Pat. No. 4,897,015, issued on Jan. 30, 1990 specifically incorporated herein by reference, there is illustrated a robot arm of the type shown in FIG. 1. As shown there a robot arm comprises a base support 12 outward from which is a cantilevered multi-leg robot arm having first and second arms 14 and 16 and a terminal end effector 18. The end effector 18 in the embodiment for use in semiconductor wafer handling includes a "Y" shaped termination having fingers 20 adapted to cradle a semiconductor wafer 22 while leaving a center portion 24 uncovered for placing of the wafer upon diverse instruments.

The leg 14 is joined to the base member 12 through a pivot housing 30. The legs 14 and 16 are pivotally joined through a pivot housings 32. The leg 16 and the hand 18 are joined through a pivot housing 34. A pulley within the housing 32, and fixed to the leg 16, has a diameter of one normalized unit. A belt 36 is wrapped around that pulley and extends to a pulley of two normalized units diameter within the housing 30. A pulley of one normalized unit diameter within the housing 32 is affixed to the leg 14 and has wrapped about it a belt 38 which is wrapped about a pulley of two normalized units diameter which is in turn affixed to the hand 18.

The base member 12 contains three motion systems, independently controllable by a r $\theta$ z control electronics 40. Electronics 40 control individual motional systems within the base member 12 which produce independent r $\theta$ z motion along the axis generally located at 42. It will be appreciated that the r direction of motion is strictly linear along a line passing through the center of the wafer 22 and the center or rotational axis of the housings 34 and 30. Such r motion is accomplished by rotating the leg 14 about the axis of the housing 30 while maintaining the pulley of two normalized units diameter fixed within the housing 30. $\theta$ motion is accomplished by rotating the entire housing 30 and leg 14 as a unit, while z motion is accomplished by elevating the housing 30 and arm 14 as a unit, or alternatively by elevating the base 12 above a support.

The ratio of pulley couplings and their arrangement produces a strictly r or radial motion of the hand 18 independent of motion in either $\theta$ or z. Also both $\theta$ and z motions are produced by the motor systems within the base 12 as independent motions with respect to the other two axis.

A pedestal 50 rotationally supports a vacuum chuck 52 on which the wafer 22 may be supported with the vacuum chuck supported to hold the wafer in the region 24 between the fingers 20 of the hand 18. Combined r $\theta$ z motion of the robot arm can position the wafer 20 over the vacuum chuck while the arm is then lowered to transfer support for the wafer from the hand 18 to the vacuum chuck 52.

An edge sensor 54 of capacitive or other design is provided to detect the position of the edge of the semiconductor wafer 22 as it is rotated on the vacuum chuck 52. That positional information is provided to an offset detect and control circuit 56 which, in accordance with the teaching of the above-identified U.S. Pat. No. 4,457,664, determines the amount and angle of misalignment of the wafer 22 upon the vacuum chuck 52 and correspondingly of the degree to which the wafer was misaligned upon the hand 18 when originally transferred from the hand to the vacuum chuck 52.

Figure 2:
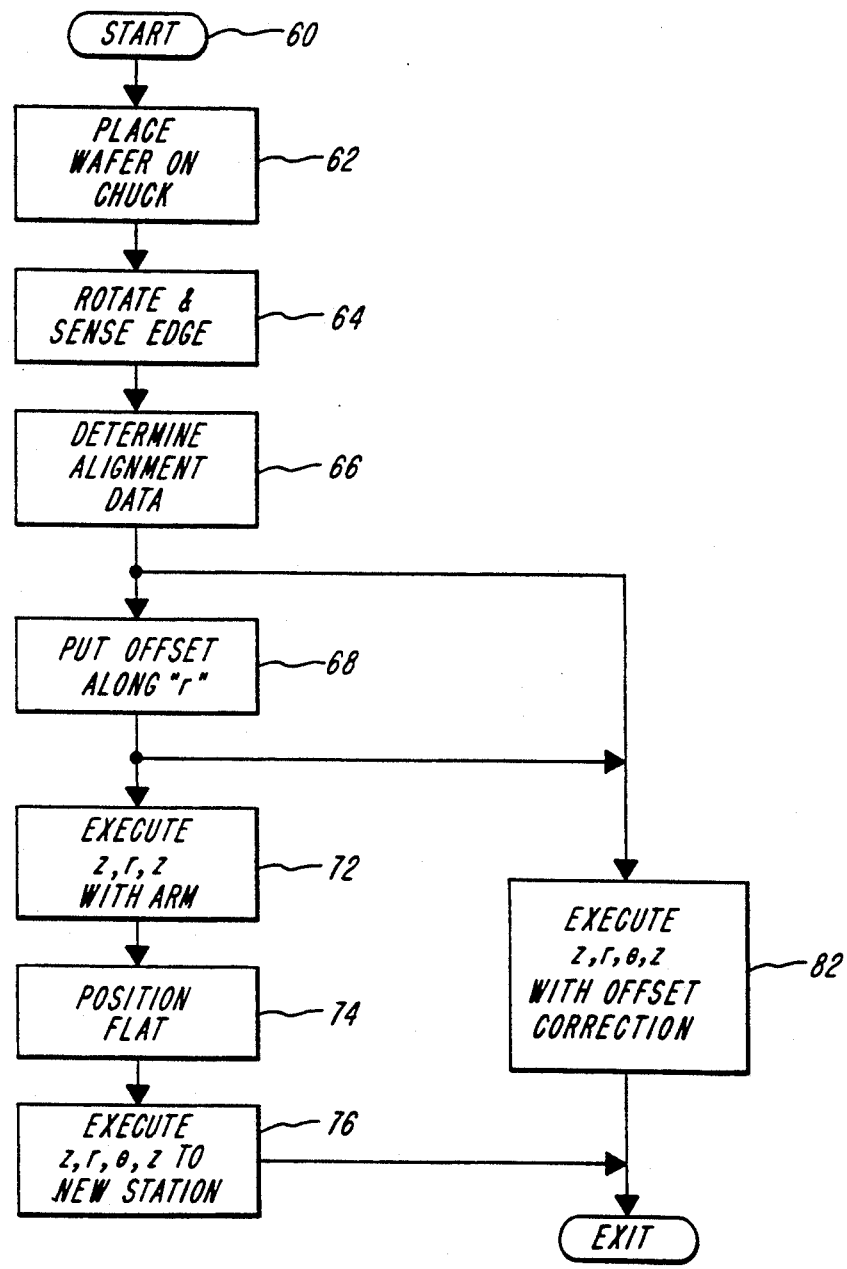
FIG. 2 illustrates operation of the system of FIG. 1.

In one case this information is utilized in accordance with the processing of FIG. 2 to align the wafer 22 upon the vacuum chuck 52 and to return it to the hand 18 in a predetermined alignment condition. In particular, and as illustrated in FIG. 2, from a start state 60 the robot arm is controlled by the motion systems within the base 12 to place the wafer on the vacuum chuck 52 in a step 62. In a subsequent step 64 the vacuum chuck 52 is rotated by the motor support 50. The position of the edge is detected by the sensor 54 and processed by electronics 56 to identify the position of the wafer centroid relative to the center of rotation of the vacuum chuck 52 in step 66. In subsequent step 68 the vacuum chuck 52 positions the wafer so that the offset lies along an axis 70 which is the axis through the center of the vacuum chuck in the center of the housing 30. The robot arm is then activated in step 72 and the wafer picked up by the hand 18 and moved along the axis 70, strictly in linear motion along the r direction, to reposition the wafer upon the vacuum chuck 52 so that its centroid is positioned upon the axis of rotation. Steps 64 through 68 may be repeated one or more times for verification or for error minimization purposes.

Thereafter in step 74 the position of an artifact such as the fiducial or flat on the wafer 22 is placed in a predetermined location and in a subsequent step 76 the robot arm is activated and the wafer transferred to the hand 18 with a now predetermined known alignment. With a predetermined number of independently controlled and quantified steps in the r, $\theta$, z directions produced by the motional systems within the base 12, the wafer 22 may be repositioned at a predetermined subsequent station, such as station 80, with a predetermined alignment.

Alternatively, in a second case, the operation may branch after steps 66 or 68 to a step 82 in which the wafer 22 is transferred to the hand 18 prior to realignment on the vacuum chuck 52, but with a known degree of misalignment. The water 22 is then transferred by the robot arm under the control of the motion systems in the base 12 to move the wafer 28 a prescribed number of steps in independent r, $\theta$, z direction, with a misalignment offset calculated into the motional steps, to position the wafer at the station 80 in the same predetermined alignment.

Since the robot arm of FIG. 1 may have a small amount of slack or backlash, a specific sequence of motions for the steps 72, 76 and 82 is preferable. Generally the robot arm will execute a preliminary motion in one or both r and $\theta$ prior to pick up of an aligned wafer, or wafer with known misalignment, in the same direction as the motion in r and $\theta$ that the arm will conclude its motion with after delivering the wafer in an aligned state back to the pedestal or to a desired destination. If there is slack in the arm, such preliminary motion will insure that the arm is at the same extremity of the slack at both ends of its critical motion with an aligned wafer thus cancelling much of the slack in the motion.

The use of a flexible positioning device such as the robot arm of FIG. 1 capable of positioning the wafer in independently controllable, three axes motion and in particular in independently controllable r, $\theta$, z motion provides a great deal of flexibility in element transport, particularly semiconductor wafer processing and testing. In addition, the multi axis transfer mechanism of the robot arm permits some or all misalignment of the wafer to be corrected by the transfer mechanism itself.

Figure 3:
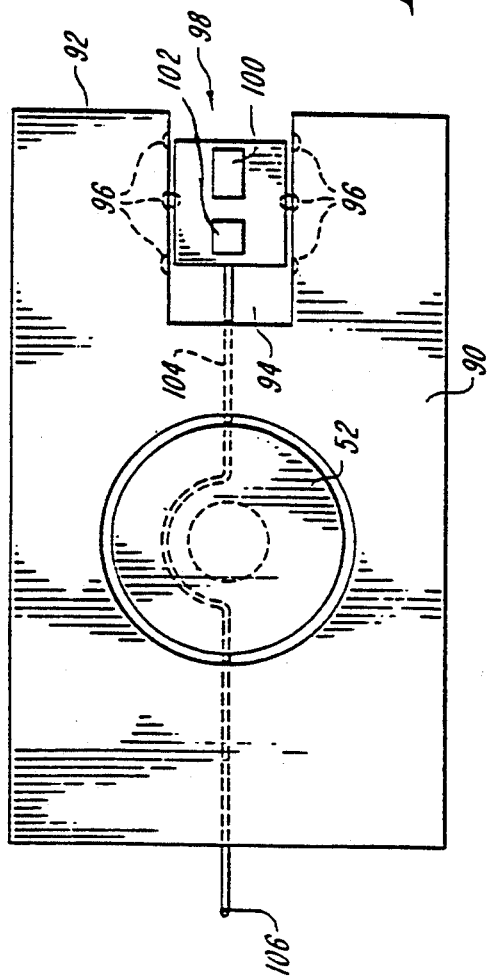
FIG. 3 is a top view of a prealigner assembly having an edge sensor selectively positionable to accomodate different wafers.
Figure 4:
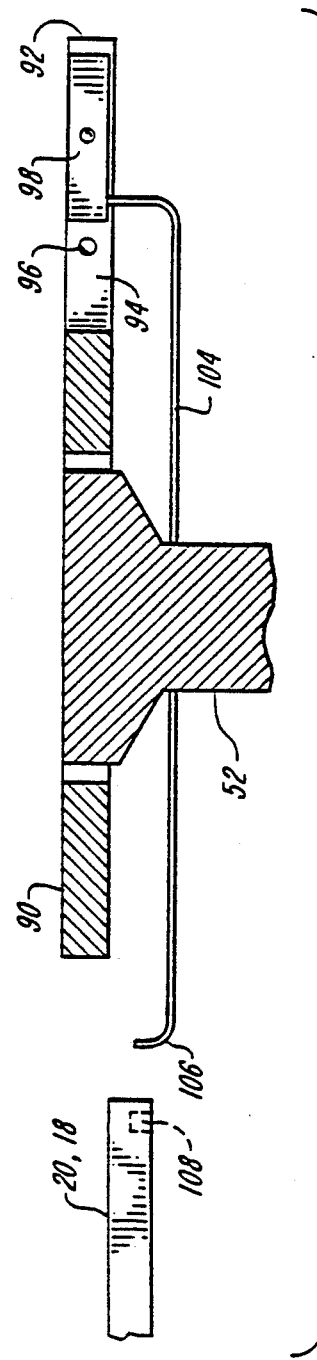
FIG. 4 is a sectional view of the assembly of FIG. 3

FIGS. 3 and 4 illustrate an alternative assembly for the prealigner support 52 and sensor 54. As shown there, the support 52 is surrounded by a platform 90 having at an end 92 a slot 94. Detents 96 are placed along the facing sides of the slot 94. An edge sensor 98 rides in the slot 94 in a horizontal direction and is restrained by guides, not shown, to travel precisely in that horizontal direction. The sensor 98 contains spring loaded projections, such as ball and socket assemblies, that click into respective detents 96 as the sensor moves horizontal to maintain the sensor in a corresponding one of several known positions. Each such position is established so that an edge sensing electrode 100 in sensor 98 is set to span the edge of a wafer of predetermined size when roughly centered on support 52. The detents 96 provide placement of electrode 10 at positions corresponding to wafers of different sizes Electrode 102 provides height compensation as described in the above referenced patent.

An arm 104 leads from the sensor assembly 98 to a hook 106, on a side of the platform 90 facing the end effector 18. A trough 108 is provided in a bottom face of a finger 20 to receive the upward projection portion of hook 106.

The central electronics 40 receives an input identifying the size of the next wafer, either from manual entry, or from a further controller for overall wafer processing that identifies diameters of a sequence of wafers to be selected, for example, from a cassette by the end effector 18. To set the sensor assembly 98 to the detent for that wafer diameter, the controller 40, using a memory identification of the current assembly 98 location, causes end effector 18 to execute an r, $\theta$, z sequence that grasps hook 106 in trough 108 and repositions the assembly 98. Alternatively, after initialization, the controller 40 causes finger 20 to move to a predetermined height and push hook 106, whatever its position, to move the assembly 98 to the outermost detent and then positions the hook 106 in trough 108 to reposition assembly 108 as desired.

Other mechanisms than that specifically exemplified above are capable of producing the same result of the present invention and accordingly it is intended to cover such embodiments to the extent they fall within the scope of the following claims.

We claim:

1. A system for combined element transport and alignment comprising:
   means for dimensionally characterizing a misalignment of an element on a pedestal, said misalignment including the position of the element centroid relative to the center of rotation of said pedestal;
   means for positioning the element on the pedestal so that said misalignment occurs along a predetermined straight line direction;
   a linear manipulator having an element holder on an articulated two leg arm, having means for angling the legs of the arm to produce a first direction of motion for said holder along a straight line, having means for providing both a second direction of motion about an axis and a third direction of motion in elevation, and having means for maintaining the angular position of the holder relative to said straight line during motion of the holder in the first direction; and means for controlling the means for positioning to align the first direction of motion along said predetermined straight line direction when said element misalignment is therealong and means for moving said element on said holder in the straight line direction as a function of the misalignment thereof.

2. The system of claim 1, wherein said characterizing means includes means for rotating said element and detecting a position of an edge of said element during rotation.

3. The system of claim 1, wherein said manipulator legs are coupled to move at an angular rate relative to each other which is twice the angular rate by which either leg moves relative to the holder.

4. The system of claim 2 wherein:
said means for moving is operative to lift the element from the pedestal in a misalignment position and to replace the element on the pedestal in an aligned position.

5. The system of claim 4, wherein said element is a semiconductor wafer.

6. The system of claim 5, wherein:
said means for controlling includes means for locating a fiducial of said wafer at a predetermined alignment relative to said straight line direction.

7. The system of claim 1, wherein said angling means, said means providing both a second direction of motion about an axis, and a third direction of motion in elevation are operative to deliver said element on said holder to a work station.

8. A method for combined element transport and alignment comprising the steps of:
dimensionally characterizing a misalignment of an element on a pedestal, said misalignment including the position of the element centroid relative to the center of rotation of the pedestal;
positioning the element on the pedestal so that misalignment occurs along a predetermined straight line direction;
producing, with a linear manipulator having an element holder on an articulated two leg arm and means for angling the legs of the arm, a first direction of motion for said holder along a straight line, a second direction of motion about an axis and a third direction of motion in elevation;
maintaining the angular position of the holder relative to said straight line during motion of the holder in the first direction; and
aligning the first direction of motion along said predetermined straight line direction when said element misalignment is therealong and moving said element on said holder in the straight line direction as a function of the misalignment thereof.

9. The method of claim 8, wherein said characterizing step includes rotating said element and detecting a position of an edge of said element during rotation.

10. The method of claim 8, wherein the moving step includes the steps of lifting the element from the pedestal in a misaligned position and replacing the element on the pedestal in an aligned position.

11. The method of claim 10, wherein said element is a semiconductor wafer.

12. The method of claim 11, wherein said aligning step includes positioning a fiducial of said wafer at a predetermined alignment relative to said straight line direction.

13. The method of claim 8, further including the step of delivering said element on said holder to a work station.

14. The method of claim 8, wherein said producing step includes the steps of providing a preliminary motion, prior to moving said element, in the same direction of at least one of r and theta directions, and a concluding motion in moving said element where said preliminary motion is in the same direction as said concluding motion.

15. The method of claim 8, further including the step of angularly positioning an artifact of said element at a predetermined angular orientation.

16. A system for combined element transport to and from a station and alignment comprising:
means for dimensionally characterizing a misalignment of an element on a pedestal, said misalignment including the position of the element centroid relative to the center of rotation of said pedestal;
means for positioning the element on the pedestal so that misalignment occurs along a predetermined straight line direction;
a linear manipulator having an element holder on an articulated two leg arm, means for angling the legs of the arm to produce a first direction of motion for said holder along a straight line, and having means for maintaining the angular position of the holder relative to said straight line during motion of the holder in the first direction;
means coupled to the linear manipulator and cooperative with the station and the pedestal for providing a controlled relative motion of said holder and station and said holder and pedestal in a second direction of motion about an axis and a third direction of motion in elevation; and
means for controlling the means for positioning to align the first direction of motion along said predetermined straight line direction when said element misalignment is therealong and means cooperative with the linear manipulator for moving said element on said holder in the straight line direction as a function of the misalignment thereof.

17. A system for combined element transport and alignment comprising:
means for dimensionally characterizing a misalignment of an element on a pedestal, said misalignment including the position of the element centroid relative to the center of rotation of said pedestal;
means for positioning the element on the pedestal so that misalignment occurs along a predetermined straight line direction;
a linear manipulator having an element holder on an articulated two leg arm means for angling the legs of the arm to produce a first direction of motion for said holder along a straight line, a second direction about an axis and a third direction of motion in elevation; and
means for controlling the means for positioning to align the first direction of motion along said predetermined straight line direction when said element misalignment is therealong and means for moving said element on said holder in the straight line direction as a function of the misalignment thereof;

said means for moving being operative to lift the element from the pedestal in a misaligned position and to replace the element on the pedestal in an aligned position.

18. Apparatus for aligning an element comprising:

a robot arm comprising a base and an arm coupled to the base for supporting said element, said arm being moveable radially, along an axis passing through the center of said base, rotationally with respect to said axis, and elevationally, wherein said radial, rotational, and elevational movements are independent of one another;

a rotatable pedestal for receiving said element from said arm, wherein said axis further passes through the center of said pedestal;

an edge sensor disposed adjacent to said rotatable pedestal for sensing the position on an edge of said element relative to a predetermined location of said pedestal, wherein said sensed edge position corresponds to an offset characterized by an angle of offset and a magnitude of offset between the centroid of said element and said center of rotation of said pedestal; and electronics, responsive to said sensed edge position, for providing a rotation control signal representing said sensed angle of offset, wherein said rotatable pedestal is responsive to said rotation control signal to rotate said pedestal so that said offset is aligned with said axis, wherein said element is supported by said arm and moved radially along said axis to reduce said sensed magnitude of offset.

19. The apparatus recited in claim 18 wherein said edge sensor senses said edge position as said element is rotated on said pedestal.

20. The apparatus recited in claim 19 wherein said robot arm comprises means for delivering said element on said arm to a station with a predetermined alignment.

21. A method for aligning an element comprising the steps of:

placing said element on a rotatable pedestal, said element having an edge and a centroid associated therewith;

sensing the position of said edge relative to a center of rotation of said pedestal, wherein said sensed edge position corresponds to an offset characterized by an angle of offset and a magnitude of offset between the centroid of said element and said center of rotation of said pedestal;

rotating said element on said pedestal in response to said sensed angle of offset so that said offset is aligned with a predetermined axis; and supporting said element with a robot arm, said robot arm being moveable radially along said predetermined axis, rotationally with respect to said axis, and elevationally, wherein said radial, rotational, and elevational movements are independent, to move said element radially along said predetermined axis to reduce said sensed magnitude of offset.

22. The method recited in claim 4 further comprising the step of transporting said element to a station with a predetermined alignment by supporting said element with said robot arm and moving said robot arm to said station.

* * * * *

UNITED STATES PATENT AND TRADEMARK OFFICE
CERTIFICATE OF CORRECTION

PATENT NO. : 5,332,352
DATED : July 26, 1994
INVENTOR(S) : Noel S. Poduje, et al.

It is certified that error appears in the above-indentified patent and that said Letters Patent is hereby corrected as shown below:

Column 1, line 40, "water edge" should read --wafer edge--.

Column 1, line 67, "invention; p" should read --invention;--.

Column 3, line 49, "water 22" should read --wafer 22--.

Column 5, line 23, "misalignment position" should read --misaligned position--.

Column 8, line 29, "The method recited in claim 4" should read --The method recited in claim 21--.

Signed and Sealed this

Twelfth Day of September, 1995

Attest:

BRUCE LEHMAN

Attesting Officer

Commissioner of Patents and Trademarks